Figure 1:
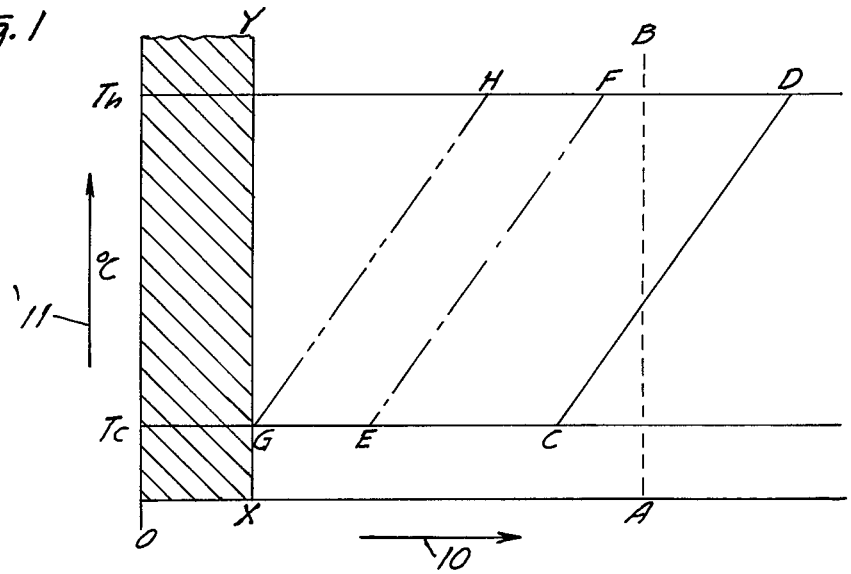

United States Patent [19]

Hampl, Jr.

[11] 4,029,520
[45] June 14, 1977

[54] THERMOELECTRIC GENERATORS THAT INCORPORATE SELF-SEGMENTING THERMOELECTRIC LEGS

[75] Inventor: Edward F. Hampl, Jr., St. Paul, Minn.

[73] Assignee: Minnesota Mining and Manufacturing Company, St. Paul, Minn.

[22] Filed: May 28, 1974

[21] Appl. No.: 473,553

Related U.S. Application Data

[63] Continuation of Ser. No. 293,862, Oct. 2, 1972, abandoned, which is a continuation of Ser. No. 36,131, May 11, 1970, abandoned, which is a continuation-in-part of Ser. No. 635,948, April 20, 1967, abandoned, which is a continuation-in-part of Ser. No. 463,148, June 11, 1965, abandoned.

[52] U.S. Cl. ............................. 136/205; 136/237;
136/238; 136/241; 252/62.3 T; 75/153;
75/173 C
[51] Int. Cl.² .......................................... H01V 1/14
[58] Field of Search .......... 136/238, 241, 205, 237;
252/62.3 T; 75/153, 173 C

[56] References Cited

UNITED STATES PATENTS

| | | | |
|---|---|---|---|
| 2,232,961 | 2/1941 | Milnes | 136/241 |
| 2,397,756 | 4/1946 | Schwarz | 136/238 |
| 3,037,064 | 5/1962 | Rosi et al. | 136/237 |
| 3,040,539 | 6/1962 | Gaugler | 136/237 |
| 3,095,330 | 6/1963 | Epstein et al. | 136/238 |
| 3,132,488 | 5/1964 | Epstein et al. | 136/241 |

FOREIGN PATENTS OR APPLICATIONS

| | | | |
|---|---|---|---|
| 106,379 | 1/1939 | Australia | 136/238 |
| 501,410 | 2/1939 | United Kingdom | 136/238 |

OTHER PUBLICATIONS

Miyatani, "Journal of the Physical Society of Japan", vol. 15, No. 9, pp. 1586–1595 (1960).

*Primary Examiner*—Harvey E. Behrend
*Attorney, Agent, or Firm*—Donald M. Sell; Roger R. Tamte; Cruzan Alexander

[57] ABSTRACT

The contact members used with thermoelectric legs formed from self-segmenting thermoelectric compositions (compositions in which a constituent migrates under the influence of combined thermal and electrical gradients to create a gradation of doping levels that is beneficial for thermoelectric conversion) should be specially chosen to compensate for and best take advantage of the self-segmenting feature. In general, at least an exterior thickness of the contact member against the end of the leg toward which the migrating constituent moves should include the constituent at substantially its free-state chemical potential.

5 Claims, 3 Drawing Figures

THERMOELECTRIC GENERATORS THAT INCORPORATE SELF-SEGMENTING THERMOELECTRIC LEGS

REFERENCE TO RELATED APPLICATIONS

This application is a continuation of an earlier application, Ser. No. 293,862, filed Oct. 2, 1972, now abandoned which was in turn a continuation of Ser. No. 36,131, filed May 11, 1970, and now abandoned. Ser. No. 36,131 was a continuation-in-part of Ser. No. 635,948, filed Apr. 20, 1967, and now abandoned, and that application was a continuation-in-part of Ser. No. 463,148, filed June 11, 1965, and now abandoned.

Thermoelectric conversions of heat energy to electric energy occur by movement or current carriers (electrons or "holes") through a thermoelectric leg that is located in a thermal gradient. Traditionally in the thermoelectric art, it has been thought that the only useful movement of species within a thermoelectric leg was the movement of current carriers. Although there could be other mobile species in the composition from which the leg was formed, such as ions or atoms, useful thermoelectric compositions were regarded as those in which the movement of these other species was a sufficiently slow migration—occurring over a year or more, for example—that the other movements could be generally disregarded and the composition would have rather stable thermoelectric properties over most of the period of migration.

The present invention is a break from tradition in that it is based on a recognition with respect to "defect-doped," "mixed-valence" compositions that movement of other mobile species in these compositions may significantly and beneficially affect the thermoelectric conversion efficiency of these compositions. Mixed-valence compositions are compositions in which at least one of the ingredient elements is capable of existing in the composition at two valence states. Defect-doped compositions are compositions in which current carriers are provided by the natural formation of a non-stoichiometric lattice structure that omits from, or adds to, the lattice structure a small percentage of one or more kinds of the elements of the composition. Thus, for P-type compositions that comprise metal elements and chalcogens, metal atoms are omitted (or chalcogen atoms added) giving rise to acceptor energy levels that are higher than the normal energy levels for the valence band of electrons in the metal atoms. When the composition is placed in a thermal gradient, the thermal excitation of the valence electrons to the acceptor energy levels produces holes which are the principal current carriers for P-type compositions. For N-type compositions, excess metal atoms are added to the lattice structure (or chalcogen atoms omitted), thereby producing donor energy levels, which in turn are easily achieved by valence electrons under thermal excitation to produce the electrons which are the principal current carriers for N-type compositions.

Applicant has discovered that the omitted or added metal atoms, which carry ionic charges, may move in the composition under the combined influence of a thermal gradient and an electrical gradient (a voltage drop associated with the passage of electric current through the length of the composition) until a steady-state condition is reached in which the atoms or ions are distributed in an infinitely graded series of different concentrations throughout the length of the gradient. Each different concentration of atoms or ions accomplishes a correspondingly different doping level, that is, a different concentration of current carriers. In a P-type composition, for example, movement of metal atoms or ions toward the cold end of a thermoelectric leg made from the composition leaves additional holes at the hot end of the leg, thus increasing the doping level at the hot end. Over the length of the leg there is a gradation of doping levels, varying infinitely from a large number of current carriers at the hot end to a lower number at the cold end. As is well known, such a gradation of doping levels is desirable to achieve optimum thermoelectric conversion efficiency. Some have previously assembled physically discrete segments into a unitary thermoelectric leg, each segment having a doping level that is appropriate on the average for the portion of the thermal gradient in which the segment will lie. In contrast to that physical segmenting procedure, the described compositions self-segment, that is, automatically achieve a gradation of doping levels beneficial for thermoelectric conversion properties.

The steady-state condition that results when the atoms or ions have been redistributed in defect-doped mixed-valence compositions has certain elements of stability. This stability is dynamic in the sense that perturbations of the system tend to be erased. For a given thermal gradient, current, and vapor pressure, there is a unique steady-state dopant distribution. External modifications of the dopant level are compensated within the element. For example, if the average doping level is too low (too many metal atoms or ions in a P-type leg), then the excess metal atoms are extruded at the cold end, whereas if the doping level is too high (too many chalcogen atoms), then the excess chalcogen atoms vaporize at the hot ends. The stability of this system may be contrasted with the instability of most prior systems, in which the migration of constituent species may lead to the eventual failure of thermoelectric legs, rather than to steady-state operation.

Figure 2:
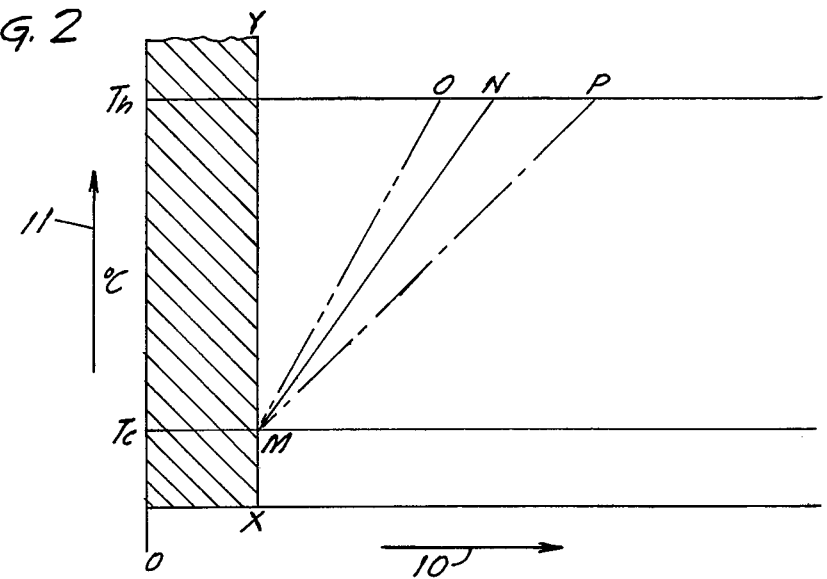
Figure 3:
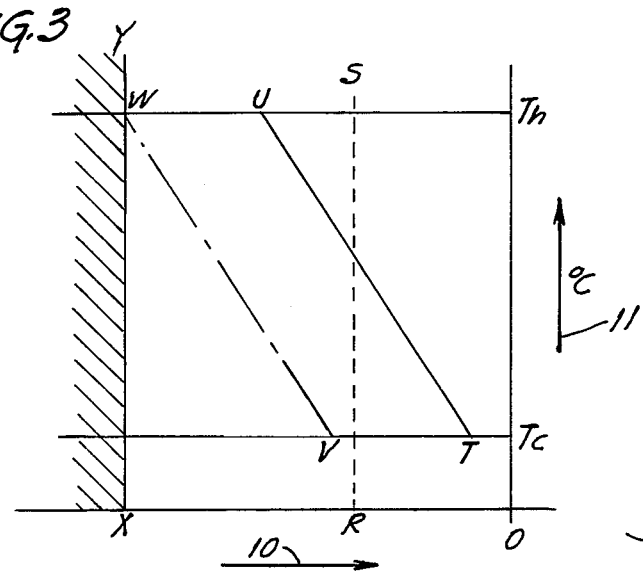

The attached drawings illustrate the distribution of atoms and ions in a defect-doped composition. FIGS. 1 and 2 are graphs of metal atom or ion concentration versus temperature for a P-type composition that exhibits the described movement of atoms or ions in thermal and electrical gradients; the graph of FIG. 1 assumes the composition is operated without the benefit of the present invention; and the graph of FIG. 2 assumes the composition is operated with the benefit of the present invention. FIG. 3 is a plot like FIG. 1, but for an N-type composition.

In FIG. 1, the point 0 represents the number of metal atoms and ions required for a stoichiometric balance of metal and chalcogen elements; the arrow 10 shows the direction of decreasing metal atom and ion concentration; the arrow 11 shows increasing temperature; and $T_h$ and $T_c$ represent the temperatures at the hot and cold ends, respectively, of a thermal gradient. The dashed line AB represents the number of metal atoms, or ions included as part of the lattice structure of the composition before the composition is placed in a thermal gradient with an electrical current passing through it. The line is displaced from the point 0 since the lattice structure of the composition is inherently nonstoichiometric. As shown, the number of metal atoms or ions is initially uniform throughout the length of the leg. Under the influence of the thermal and electrical gradients, the metal atoms or ions are redistributed by the movement described above, so that the number of atoms or ions incorporated in the lattice structure decreases at the hot end and increases at the cold end. Line CD represents the condition after redistribution and shows the concentration of metal atoms or ions at a segment in the material as a function of temperature. The slope of the line CD is determined by the magnitudes of the thermal and electrical gradients.

Although defect-doped mixed-valence compositions have the elements of stability noted above, a condition of the material represented by the line CD is not fully stable. In the course of a rather short period of operation of the composition at elevated temperatures, or for longer times at more moderate temperatures, some chalcogen is lost by vaporization at the hot end. This process leads to an increase in the proportion of metal ions and a consequent drift of the metal ion distribution line CD to the left to a condition represented by the broken line EF. With this increase in the concentration of the metal ions, the doping levels in the composition also change as noted above; and, as a result, the thermoelectric conversion characteristics of the composition also change. The drift to the left does not proceed indefinitely, however. It stops at the broken line GH, when the metal solubility limit for the composition is reached at the cold end (that is, when the chemical potential of the metal as incorporated in the non-stoichiometric compound at the cold end equals the chemical potential of the metal in its free state; this condition occurs when the number of metal atoms or ions at the cold end reaches the number represented by the point G).

The condition represented by the line GH may be described as a condition in which the composition is operating on the border of a two-phase region. Any excess of metal ions beyond the number represented by the point G results in conversion of the metal ions to metal atoms at their free-state chemical potential. These metal atoms exist as a second phase. It should be noted that the boundary of the second phase metal, the line XY, will generally not be a straight line as it is shown in FIG. 1, due to the fact that the extent of the solubility of the metal in the compound depends on temperature. If there are sufficient metal atoms, they are extruded from the cold end of the thermoelectric leg, typically as narrow "whiskers" of metal.

When the composition is operating on the border of a two-phase region, as represented by the line GH, no further changes in the thermoelectric characteristics of the composition occur so long as the thermal and electrical gradients are not changed. Additional sublimation of chalcogen does not shift the line GH nor change its slope, but merely results in a proportional increase in the free metal at the cold end. And if there are changes in the thermal or electrical gradients the point G remains fixed and simply the slope of the line GH changes.

There are at least two major problems with a thermoelectric leg operating in the manner shown in FIG. 1. First, the thermoelectric leg does not immediately operate at a steady-state value, but exhibits the change in thermoelectric characteristics that accompanies the drift of the line CD to the position GH. For example, the following table shows the time required before a copper-silver-selenium thermoelectric leg as described in my earlier application, Ser. No. 635,948, operating in the manner of FIG. 1 and under a matched load current of 2 amperes will achieve a steady state operation; the leg tested was 0.25 inch in diameter and 0.4 inch long. As the table shows, the approximate time to reach steady state varies depending on the temperatures at the hot and cold ends ($T_h$ and $T_c$, respectively).

| $T_h$ (° C) | $T_c$ (° C) | Approximate time to reach steady state (hours) |
| --- | --- | --- |
| 800 | 250 | 50 |
| 700 | 260 | 700 |
| 600 | 240 | 2500 |
| 500 | 210 | 10,000 (and still not steady) |

A second problem with a thermoelectric leg that operates in the manner shown in FIG. 1 is that the extrusion of metal from the cold end and the evaporation of chalcogen from the hot end decrease the efficiency and reliability of a generator that incorporates such a leg. Thus, if metal extrudes at the interface between the end of a leg and the electrode, it may drastically increase the resistance present in the whole system by reducing the area of contact between the leg and electrode. For example, in one test using the copper-silver-selenium leg described above, pressure-engaged by molybdenum electrodes under a pressure of 150 pounds per square inch, and operating with a hot-junction temperature of 750° C. and a cold-junction temperature of 150° C., the resistance between the leg and electrode became ten times more than the resistance of the leg itself as a result of extrusion of whiskers from the cold end of the leg. Further, at the same time as electrical resistance increases, the thermal impedance through the thermoelectric leg increases; as a result the thermal gradient across the leg is reduced, with a consequent further reduction in thermoelectric conversion efficiency. Extrusion of metal is also undersirable since it may create short-circuiting paths within the generator.

Exaporation of chalcogen from the hot end is undesirable since it may "poison" or chemically react with other components of a generator, and thus lead to premature failure of the generator. Also, evaporation of chalcogen has sometimes been found to occur to the extend that the end of the leg is pitted sufficiently to noticeably increase the electrical resistance between the hot end of the leg and its electrode.

The present invention avoids the kind of operation represented in FIG. 1 and it does it by a proper choice of contact members placed against the ends of the thermoelectric leg. The object of this choice of contact members is to establish a reservoir of the migrating constituent, or of at least one of the migrating constituents if there is more than one, at substantially its free-state chemical potential, and to place that reservoir in contact with the end of the leg toward which the constituent moves. Thus, at least an exterior thickness of a contact member placed against the end of the leg toward which the constituent moves should contain that constituent at substantially its free-state chemical potential. The contact member placed against the other end of the leg, the end which the migrating constituent moves away from, is free of that constituent at its free-state chemical potential.

For purposes of this specification, "contact member" means any physical structure placed in electrical contact against the end of a thermoelectric leg. For example, a preferred way of establishing the described reservoir is to metallurgically bond the electrode member that electrically connects a thermoelectric leg into the thermoelectric generator circuit to the end of the leg with a solder that incorporates the migrating constituent at its free-state chemical potential. Thus, electrodes (of copper, nickel, or other good metal conductor) are soldered to the end of a copper-silver-selenium or copper-silver-tellurium thermoelectric leg as described in my earlier application, Ser. No. 635,948, with a copper-silver outectic solder. The migrating constituent in copper-silver-selenium or copper-silver-tellurium thermoelectric legs appears to be mainly copper, and copper exists at substantially its free-state chemical potential in the copper-silver alloy solder. Silver has an appreciable mobility in these compositions, and it also exists at substantially its free-state chemical potential in the solder. Either the layer of solder between the end of the leg and the electrode, or the assembly of electrode and layer of solder, may be regarded as the contact member. Rather than being metallurgically bonded to the end of a thermoelectric leg, a contact member of the invention may be simply pressed against the leg. It should be noted that the extrusions of a migrating cnstituent from the end of the leg also constitute a reservoir, but as noted above, as normally produced those extrusions are generally undersirable.

The reason for placing the reservoir of migrating constituent at its free-state chemical potential at the end of a thermoelectric leg toward which the constituent moves is that the composition of the thermoelectric leg will operate on the border of a two-phase region rather than exhibit the drift described in FIG. 1 from the time the reservoir is placed against the end of the leg. The operation of a P-type thermoelectric leg with the described reservoir at the end of the leg is shown by the graph of metal atom and ion concentration versus temperature pictured in FIG. 2. Again the point O represents stoichiometry; the arrow 10 shows the direction of decreasing metal atom and ion concentration; and $T_n$ and $T_c$ represent the temperatures at the hot and cold ends, respectively, of a thermal gradient. As soon as the thermoelectric generator is operated—that is, heat is supplied to the hot ends of the thermoelectric legs and electricity is generated by the generator and supplied to a load— the distribution of migrating atoms or ions will be as described by the line MN. The slope of the line describing the distribution of migrating atoms or ions may change from that of MN to that of MO or MP because of changes in the hot-junction or cold-junction temperatures or because of changes in the amount of current flowing through the legs. But the number of migrating atoms or ions at the cold end remains fixed at the level represented by the point M. And if the thermal and electrical gradients remain the same, there will be no changes in the metal atom and ion concentration over the whole length of the leg and thus no changes in the basic thermoelectric conversion parameters, Seebeck coefficient, resistivity, and thermal conductivity.

Further, the tendency for the constituent to be extruded from the leg is greatly reduced so that, for example, applicant has never observed the extrusion of copper after an electrode has been soldered against a copper-silver-selenium leg with copper-silver solder as described above. To illustrate the difference, two sets of thermoelectric legs were manufactured from one batch of copper-silver-selenium alloy composition comprising 66.5 atomic percent copper, 1 atomic percent silver, and 33.5 atomic percent selenium as described in my earlier application, Ser. No. 635,948. One set of the legs were pressed against carbon electrodes, and the other set of the legs were bonded to a disc of copper-silver alloy solder having an eutectic temperature of 779° C and comprising 39.9 atomic percent copper and 60.1 atomic percent silver. When the same thermal and electrical gradients were applied to the legs (790°–338° C with a current of 2 amperes), the legs pressed against the carbon electrodes exhibited whiskers of copper extruded out the cold end of the leg, while the legs bonded to copper-silver solder exhibited no such whiskers.

While the invention has been discussed with respect to P-type compositions, the invention is also applicable to N-type compositions. FIG. 3 illustrates the operation of an N-type self-segmenting thermoelectric leg of the invention without a reservoir of migrating constituent of its free-state chemical potential in contact with an end of the leg. The ordinate 0 represents the number of metal atoms or ions in a stoichiometrically balanced composition, and the arrow 10 shows the direction of decreasing metal atom or ion concentration. The dashed line RS represents the metal atom or ion concentration in a typical N-type composition without thermal and electrical gradients applied to the composition. When thermal and electrical gradients are applied to the composition, metal ions migrate toward the hot end of the leg so that the ions are redistributed to proportions represented by the line TU. But chalcogen vaporizes from the hot end of the leg, and as a result the concentration of metal ions increases until the condition represented by the line VW is achieved. Now the composition is operating on the border of a two-phase region with the result that there are no further changes in metal ion concentration at the hot end.

To achieve immediately stable, reliable, and predictable operation of the N-type leg, a reservoir of the migrating metal at its free-state chemical potential is provided at the hot end of the leg. That immediately fixes the concentration of metal ions at the hot end at the level represented by the point W. And if the composition operates under the same thermal and electrical gradients, the slope of the line VW will remain constant meaning that the number of metal ions remains constant over the whole length of the leg, and there will be no further changes in the basic thermoelectric conversion parameters, Seebeck coefficient, resistivity, and thermal conductivity.

Summarizing, the advantages provided by the present invention are obtained with self-segmenting thermoelectric compositions, which are generally mixed-valence, defect-doped compositions that exhibit a high mobility of the atoms of at least one constituent of the composition, whereby, under the influence of combined thermal and electrical gradients, the constituent moves from one end of the thermoelectric leg to the other to form inherently stable carrier concentrations that increase in magnitude from one end of the leg to the other in a direction that is beneficial for thermoelectric conversion. To best take advantage of the invention, the ionic mobility within the lattice structure should be appreciable. Such a mobility is achieved when there are a large number of nearly equivalent locations in the lattice structure for the migrating constituent. Also, the useful compositions are substantially single phase but ideally operate on the border of a two-phase region of a temperature-composition field as pictured in the drawings (that is, their most stable operation occurs when the number of atoms or ions of the migrating constituent at one end of the leg is at the maximum solubility limit for that constituent in the composition, so that any additional ions are converted to atoms at the free-state chemical potential).

In practice, the present invention will be utilized only with thermoelectric legs formed from compositions that have good values for such thermoelectric conversion parameters as Seebeck coefficient, resistivity, and thermal conductivity. As determined by traditional temperature-dependent measurements of the Seebeck coefficient, resistivity, and thermal conductivity, (which do not reflect the beneficial results of self-segmenting) compositions useful in the present invention will generally exhibit a figure of merit of at least $0.5 \times 10^{-3}$.

Generally, the useful compositions are alloy compositions of a metal and chalcogen (tellurium, selenium, sulfur, and oxygen), with the metal atoms generally selected from copper, silver, rare-earth metals, and transition metals. Semi-metallic compositions in non-stoichiometric substantially single-phase cubic crystal lattice structure forms of such rare-earth metals as erbium, neodymium, gadolinium, cerium, and lanthanum with chalcogen have the advantage that they are useful to very high temperatures (greater than 1000° C) and thus achieve improvement in efficiency; of these, erbium, neodymium, and cerium are preferred, especially with selenium, tellurium, and selenium-tellurium combinations. As an illustration, a semi-metallic erbium-telluride composition (non-stoichiometric $Er_2Te_3$) exhibits a Seebeck coefficient of about 180° at about 400° C., together with extrinsic electrical transport behavior to high temperatures, and a desirable low lattice component of thermal conductivity.

The most preferred P-type compositions are compositions of copper, silver, tellurium, and selenium as described in my earlier application, Ser. No. 635,948. Briefly summarizing, those compositions include ingredients in the following proportions: for tellurium compositions, 32.5 atomic percent ≦ Te ≦ 33.7 atomic percent 27 atomic percent ≦ Cu ≦ 67 atomic percent 0 atomic percent ≦ Ag ≦ 40 atomic percent for selenium compositions, 32.5 atomic percent ≦ Se ≦ 33.7 atomic percent 60 atomic percent ≦ Cu ≦ 67 atomic percent 0 atomic percent ≦ Ag ≦ 7 atomic percent These compositions may be cast into thermoelectric legs to form dense, uniform, continuous structures that exist in preferred substantially single-phase crystal forms when heated above a temperature that ranges between 95° and 575° C, depending on the particular composition; especially in these high-temperature crystal forms, the compositions have very excellent thermoelectric conversion properties. The best compositions include 33.2 to 33.5 atomic percent tellurium or selenium, preferably about the latter amount. Copper-silver-selenium and copper-silver-tellurium compositions that include about one atomic percent silver and copper-silver-tellurium compositions between about 32 and 36 atomic percent silver are also especially preferred.

The N-type compositions of this copper-silver-chalcogen family are also useful in the present invention. The best combination of high-temperature utility and good thermoelectric conversion properties are found with compositions that principally comprise silver, selenium, and tellurium but also include up to about 5 atomic percent copper and sulfur. The silver and copper generally comprise between about 65.7 and 67.7 atomic percent of the composition, and the silver, tellurium, and selenium lie within the following ranges:

60.7 atomic percent ≦ Ag ≦ 67.7 atomic percent 10 atomic percent ≦ Te ≦ 30 atomic percent 3 atomic percent ≦ Se ≦ 24 atomic percent.

What is claimed is:
1. In a thermoelectric generator,
A. at least one thermoelectric leg that exhibits a figure of merit of at least $0.5 \times 10^{-3}$; is operable at temperatures up to at least 800° C; consists essentially of metal elements and chalcogen elements united in a crystal lattice structure that is stoichiometric except for an excess or deficiency of metal sufficient to provide the current carriers needed for a thermoelectric composition; and has the property that atoms of said excess or deficient metal migrate from a first end of the leg toward the second end under the combined influence of thermal and electrical gradients applied to the leg by operation of said thermoelectric generator, said migration (a) forming an inherently stable gradation of current-carrier concentrations that is beneficial for thermoelectric conversion, and (b) causing the migrating metal element to be present at the second end of the leg at substantially the maximum solubility limit for the element in the lattice structure; each said thermoelectric leg in said generator having:
B. a contact member metallurgically bonded to the second end of the thermoelectric leg, with at least the exterior thickness of the contact member against the end of the thermoelectric leg consisting essentially of metal that includes said migrating metal element at substantially its free-state chemical potential; and
C. a contact member in electrical contact with the first end of the leg consisting essentially of metal that is free of said migrating metal element at its free-state chemical potential;
whereby as soon as said thermoelectric generator is operated to apply said combined thermal and electrical gradients to the leg, the migrating metal element in the second end of the leg will be in equilibrium with the migrating metal element in the contact member against the second end of the leg to permit the generator to exhibit steady-state operation.

2. A generator of claim 1 in which said leg is an N-type leg.

3. A thermoelectric generator of claim 1 in which said thermoelectric leg is a P-type thermoelectric leg that consists essentially of ingredients selected from copper, silver, and one member of the group tellurium and selenium in proportions described by the following tables: for tellurium compositions, $$32.5 \text{ atomic percent} \leq Te \leq 33.7 \text{ atomic percent}$$

$$27 \text{ atomic percent} \leq Cu \leq 67 \text{ atomic percent}$$

$$0 \text{ atomic percent} \leq Ag \leq 40 \text{ atomic percent}$$

for selenium compositions, $$32.5 \text{ atomic percent} \leq SE \leq 33.7 \text{ atomic percent}$$

$$60 \text{ atomic percent} \leq Cu \leq 67 \text{ atomic percent}$$

$$0 \text{ atomic percent} \leq Ag \leq 7 \text{ atomic percent}$$

and at least the exterior thickness of a contact member at the second end of the leg comprises copper at substantially its free-state chemical potential.

4. A thermoelectric generator of claim 2 in which said contact member at the second end of the leg comprises an electrode of highly electrically conductive metal bonded to the leg with an alloy composition that comprises copper at substantially its free-state chemical potential.

5. A thermoelectric generator of claim 1 in which an N-type thermoelectric leg comprises copper, silver, tellurium, selenium, and sulfur in proportions defined by the following table, $$60.7 \text{ atomic percent} \leq Ag \leq 67.7 \text{ atomic percent}$$

$$0 \text{ atomic percent} \leq Cu \leq 5 \text{ atomic percent}$$

$$10 \text{ atomic percent} \leq Te \leq 30 \text{ atomic percent}$$

$$3 \text{ atomic percent} \leq Se \leq 24 \text{ atomic percent}$$

$$0 \text{ atomic percent} \leq S \leq 5 \text{ atomic percent}$$

and at least the exterior thickness of a contact member at the first end of the leg comprises silver at substantially its free-state chemical potential.

* * * * *

UNITED STATES PATENT AND TRADEMARK OFFICE
CERTIFICATE OF CORRECTION

PATENT NO. : 4,029,520
DATED : June 14, 1977
INVENTOR(S) : Edward F. Hampl, Jr.

It is certified that error appears in the above–identified patent and that said Letters Patent are hereby corrected as shown below:

In column 4, line 39, "Exaporation" should be --Evaporation--.

In column 4, line 44, "extend" should be --extent--.

In column 5, line 9, "outectic" should be --eutectic--.

In column 5, line 23, "cnstituent" should be --constituent--.

In column 6, line 19, "of" should be --at--.

In column 7, line 33, "180°" should be --180--.

In column 9, line 18, "2" should be --3--.

Signed and Sealed this

Fourth Day of October 1977

[SEAL]

Attest:

RUTH C. MASON
Attesting Officer

LUTRELLE F. PARKER
Acting Commissioner of Patents and Trademarks